United States Patent [19]
Sakui et al.

[11] Patent Number: 5,615,163
[45] Date of Patent: Mar. 25, 1997

[54] SEMICONDUCTOR MEMORY DEVICE

[75] Inventors: Koji Sakui, Tokyo; Hiroshi Nakamura, Kawasaki; Tomoharu Tanaka, Yokohama; Masaki Momodomi, Yokohama; Fujio Masuoka, Yokohama; Takehiro Hasegawa, Yokohama, all of Japan

[73] Assignee: Kabushiki Kaisha Toshiba, Kawasaki, Japan

[21] Appl. No.: 598,706

[22] Filed: Feb. 8, 1996

Related U.S. Application Data

[63] Continuation of Ser. No. 360,289, Dec. 21, 1994, Pat. No. 5,517,457.

[51] Int. Cl.⁶ .................................................. G11C 13/00
[52] U.S. Cl. ............................ 365/230.03; 365/235
[58] Field of Search .............................. 365/182, 189.01, 365/189.04, 230.01, 230.03, 235

[56] References Cited

U.S. PATENT DOCUMENTS 4,694,428  9/1987  Matsumura ........................ 36/189.01

*Primary Examiner*—Terrell W. Fears
*Attorney, Agent, or Firm*—Oblon, Spivak, McClelland, Maier & Neustadt, P.C.

[57] ABSTRACT

An NAND cell type EEPROM comprising a memory cell array wherein an NAND cell unit having a plurality of electrically rewritable memory cells is connected in series, and the NAND cell is formed on a semiconductor substrate in a matrix array, a plurality of control gate lines CG each provided to cross an NAND cell group of the same row, bit lines BL each provided to cross the NAND cell group of the same column, wherein driver circuit are provided at both sides of the memory cell array in a ratio of one to two NAND cell units so as to drive the control gate lines CG, the plurality of the control gate lines CG, provided to cross the NAND cell unit of the even row, is connected to the left driver circuit, and the plurality of the control gate lines CG, provided to cross the NAND cell unit of the odd row, is connected to the right driver circuit.

12 Claims, 12 Drawing Sheets

SEMICONDUCTOR MEMORY DEVICE

This is a continuation, of application Ser. No. 08/360,289 filed on Dec. 21, 1994 now U.S. Pat. No. 5,517,457.

BACKGROUND OF THE INVENTION

1. Field of the Invention

The present invention relates to a semiconductor memory device and more particularly to a semiconductor memory device wherein a plurality of memory cells are connected to form memory cell units.

2. Description of the Related Art

Conventionally, as one of the semiconductor memory devices, there have been known EEPROMs, which are capable of electrically rewriting. Among the EEPROMs, there has been noticed an EEPROM called NAND cell type wherein a plurality of memory cells are connected in series to form a unit one end of which is connected to a bit line and a high integration can be attained.

One memory cell of the NAND cell type EEPROM comprises an FETMOS structure in which a floating gate (charge storage layer) and a control gate are layered on a semiconductor substrate through an insulating film, and an NAND cell is formed, and a plurality of memory cells are connected in series in a form that the plurality of the adjacent memory cells use a source and a drain in common. Such NAND cells are arranged in a matrix array, so that a memory cell array is formed.

A drain which is one end of each of the NAND cells arranged in an array direction of the memory cell array is connected in common to a bit line through a select gate transistor, and a source which is the other end is connected to a common source line through another select gate transistor. Control gates of memory transistors and gate electrodes of select gate transistors are connected in common to each other in a column direction of the memory cell array, each serving as a control gate line (word line) and a select gate line.

An operation of the NAND cell type EEPROM will be explained as follows.

Data writing is executed in order from the memory cell which is far from the bit line. In the case of n channel, high voltage (for example 20 V) is applied to the control gate of the selected memory cell, and an intermediate voltage (for example, 10 V) is applied to the control gate of the non-select memory cell which is on the side of the bit line, and the gate of the select gate transistor. 0 V (for example "1") or an intermediate voltage (for example "0") is applied to the bit line according to data. At this time, the voltage of the bit line is transmitted to the channel of the select memory cell through the select gate transistor and the non-select memory cell.

When there is data to be written (data is "1"), a high electrical field is applied between the gate and channel of the select memory cell, and an electron is tunnel-injected to the floating gate from the substrate. Thereby, a threshold value of the select memory cell is moved in a positive direction. When there is no data to be written (data is "0"), the threshold value is unchanged.

For erasing data, high voltage is applied to a p-type substrate (an n-type substrate in a case of a well structure and a p-type well formed thereon), and the control gate of all memory cells and the gate of the select gate transistor are set to 0 V. Thereby, in all memory cells, the electron of the floating gate is emitted to the substrate, and the threshold value is changed to a negative direction.

For reading data, the select gate transistor and non-select memory cell other than the select memory cell are turned on, and 0 V is applied to the gate of the select memory cell. At this time, current flowing to the bit line is read, thereby discriminating between "0" and "1".

In such a conventional NAND cell type EEPROM, there is a problem in a mismatch of delay time of the control gate in data reading or writing, that of delay time of rise of the select gate and that of delay time of fall of the select gate.

For example, in the case of an NAND cell type EEPROM of 32M bits, if a width of one control gate line is 0.5 μm, a length thereof is 7500 μm, a sheet resistance ρ is 70Ω per 1 μm×1 μm, a resistance is 1050 kΩ, approximately 1 MΩ. Also, a capacity is 4.5 PF, and its CR time constant is CR=4.5 PF×1 MΩ=4.5 μS. In SPICE simulation, the build up time of the control gate line results in 7.0 μS up to 90% of power supply voltage Vcc.

FIG. 1 shows a layout of a core section of a conventional 4M bit, 16M bit, and 32M bit NAND cell type EEPROMs. BL0 to BLm are bit lines, CGN1 to CGN8: control gate lines, SGN: a drain side select gate line, and SG8 is a source side select gate line.

As shown in the FIG. 1, control gate lines (odd numbers) CGN1, CGN3, CGN5 and CGN7, and the drain side select gate line SGN are controlled by driver odd circuits arranged at the left side of the FIG. 1. The control gate lines (even numbers) CGN2, CGN4, CGN6 and CGN8, and the source side select gate line SGS are controlled by driver even circuits arranged at the right side of FIG. 1.

The reason why the driver circuits to the NAND cell group of the same row are divided into the even circuits and the odd circuits is that a drive element for one control gate line cannot be provided in the pitch of the control gate line.

FIG. 2 shows the specific structure of the first decoder circuit, the driver circuits, and the NAND cell columns, of the core section of the NAND type EEPROM of FIG. 1.

At the time of the reading operation, for example, in a case where the control gate line CGN3 is selected, data of the memory cells Cellj30 to Cellj3m, which are connected to CGN3 is read to the bit lines BL0 to BLm, the control gate line CGN3 is charged to the ground voltage Vss (0 V), and the other control gate lines CGN1, CGN2, CGN4 to CGN8, and the select gate lines SGN and SGS are charged to the power supply voltage Vcc (5 V).

In this case, the driver circuits of the control gate lines and the select gate lines are arranged to be divided right and left, and the CR constants of the control gate lines and the select gate lines are high, i.e., 4.5 μS. Due to this, there is a problem in that timing of charging/discharging does not coincide with each other between the odd and even control gate lines, and the select gate lines of the drain side and the source side.

More specifically, for example, Cellj10 to Cellj80, which are connected to the BL0, will be explained as follows.

The control gate lines (odd numbers) CGN1, CGN5, CGN7 and the drain side select gate line SGN are charged to 5 V by the driver odd circuit nearest the Cellj10 to Cellj80. At this time, the control gate lines (even numbers) CGN2, CGN4, CGN6, CGN8 and the source side select gate line SGS are charged to 5 V by the driver even circuit farthest from the Cellj10 to Cellj80.

As explained above, in the same NAND cell, if the driver circuits of the control gate lines and the select gate lines are arranged to be divided right and left, there is a problem in that timing of charging/discharging does not coincide with each other in the odd and even control gate lines of the same NAND cell. In the case of, e.g., the 32M bit NAND cell type EPROM, the line pitch of the control gate line is 1.05 μm (line width 0.55 μm/space 0.50 μm), the driver circuit for one control gate line cannot be provided in this pitch. Due to this, it is needed that the driver circuits be divided right and left.

Moreover, according to the conventional NAND cell type EEPROM, an output signal CLKALj,/CLKAj of the decoder circuit are inputted to both driver odd circuits on left side and driver even circuits on right side. Due to this, the output signals CLKAj,/CLKAj must run on the memory cell array, and there occurs a problem in that a resistance capacitance is increased by the large wire length. Due to this, there is generated a time difference in the timing for inputting the output signals CLKAj,/CLKAj of the decoder circuit to the driver odd circuits on left side and the driver even circuits on right side, and a high speed reading operation is prevented by the time difference.

Furthermore, since the wiring of the output signals CLKAj,/CLKAj is formed to cross the right and left of the memory cell array, it is needed that a wiring layer be formed to be different from the control gate lines, select gate lines, and the bit lines. More specifically, in a case where the floating gate uses polysilicon of the first layer the control gate line and the select gate line use polysilicon of the second layer, the wiring of the output signals CLKAj,/CLKAj is formed of A1 if the bit line uses polysilicon of the third layer. Reversely, if the wiring of CLKAj,/CLKAj uses polysilicon of the third layer, the bit line is formed of A1. In this way, in the conventional NAND cell type EEPROM, since the wiring of the output signals CLKAj,/CLKAj is formed to cross the right and left of the memory cell array, three polysilicon layers and one A1 layer are needed.

Then, as shown in FIG. 3, as a decoder circuit, if row decoders r are provided to the right of the memory cell array, and row decoders 1 to the left respectively, there is no need that the wiring of the output signals CLKAj,/CLKAj is formed to cross the right and left of the memory cell array. However, in this case, the number of the decoder circuits is doubled, and the chip area is increased, and an increase in the manufacturing cost is brought about.

Moreover, at the time of the writing operation, for example, in a case where the control gate line CGN8 is selected, data is written to the memory cells Cellj80 to Cellj8m, which are connected to CGN8, the control gate line CGN8 is charged to a high voltage Vpp (20 V), and the other control gate lines CGN1 to CGN7, and the drain side select gate line SGN are charged to an intermediate voltage Vm (10 V). Even in the writing operation, according to the layout of the conventional NAND cell type EEPROM of FIGS. 1 and 2, there is also a problem in that a time difference is generated in odd and even control gate lines of the same NAND cell and the select gate lines of the drain side and the source side from the left driver odd circuits and the right driver even circuits.

According to the conventional semiconductor memory device, a spare memory cell array is provided to save a defective bit. When an input address and an address of a defective cell are conformed to each other, the word line of the spare memory cell array is selected, and the defective cell is replaced with a spare cell.

In such a defective bit saving, as shown in FIG. 3, according to the structure in which the word line drivers and the row decoders are provided at both sides of the memory cell array, in a case where a defect such as a short-circuit between the word lines is generated between two adjacent word lines, the row decoders of both sides must be saved. In other words, the defective saving must be performed with low efficiency, such as one defect is saved by two row decoders.

As mentioned above, according to the conventional NAND cell type EEPROM, the drivers of the same NAND cell are divided into the driver even circuits and the driver odd circuits at the right and left of the memory cell array because of the limitation of the pitch of the control gate line. Due to this, there is the problem as follows.

More specifically, there is generated the time difference between charging/discharging in the odd and even control gate lines of the same NAND cell and the select gate lines of the drain and the source side, and the reading and writing operations becomes unstable, and reliability is reduced.

Moreover, according to the conventional NAND cell type EEPROM, since the output signals of the decoder circuits are inputted to both left driver odd circuits and right driver even circuits, the output signals must run on the memory cell array. Due to this, there is the problem as follows.

More specifically, one wiring layer of the output signal of the decoder circuit is needed, and the manufacturing cost is increased.

Furthermore, if the decoder circuit is provided at both sides of the memory cell array, the number of the row decoders is doubled. Due to this, the chip area is increased.

Moreover, in the structure in which the word line drivers and the row decoders are provided at both sides of the memory cell array to be driven from each side every word line, there is a problem that the saving efficiency of the defective bit is low.

Moreover, conventionally, since the driver circuit of the word lines of even numbers and that of the word lines of odd numbers, which are provided in the same cell unit, were separated into right and left sides, both side driver circuits had to be selected at the time of the operation. Due to this, since a high voltage (voltage boosted in the chip), which is necessary to erase/write data of the memory cell, must be applied to both right and left driver circuits, there occurred problems in which a load capacity of a voltage booster circuit is large, an area of the voltage booster circuit is increased, and data erasing/writing time is increased.

The above-mentioned problems are not limited to the NAND cell type EEPROM. The same problems occur in the semiconductor memory device such as a DINOR cell type EEPROM having the memory cell array comprising a plurality of memory cells connected in parallel, and an AND cell type EEPROM. Moreover, it is not limited that the above problems occur in the semiconductor memory device using a nonvolatile memory cell. It can be said that the same problems occur in the semiconductor memory device using a dynamic type cell. Furthermore, it is not limited that the above problems occur in the semiconductor memory device having memory cell units. It can be said that the same problems occur in the semiconductor memory device in which the memory cells are arranged in an array form.

SUMMARY OF THE INVENTION

An object of the present invention is to provide a semiconductor memory device wherein the number of row decoders is not increased, it is not needed that an output signal of the row decoder circuit is inputted to the right and left driver circuits without running on the memory cell array, one layer for a wiring layer is lessened, and the manufacturing cost can be reduced.

Also, another object of the present invention is to provide a semiconductor memory device wherein charging/discharging time for control lines and select gate lines in the same cell such as an NAND cell, a DINOR cell or an AND cell can be uniformly set, a stable operation can be performed at the time of reading and writing, and reliability can be improved.

Moreover, another object of the present invention is to provide a semiconductor memory device wherein a treatment for saving a case in which a short-circuit between the word lines is generated between two adjacent word lines can be simplified, and a saving efficiency of a defective bit can be improved.

In order to attain the above objects, the present invention has the following structure.

More specifically, according to a first semiconductor memory device of the present invention, there is provided a semiconductor memory device which comprises a memory cell array wherein a memory cell or a memory cell unit having a plurality of the memory cells connected is provided in an array form; row selecting means for selecting a word line of the memory cell array; and column selecting means for selecting a bit line of the memory cell array; wherein a word line driver for driving a plurality of the word lines is provided at both sides of the memory cell array, the word lines are divided into blocks each having a plurality of continually numbered word lines, and the word lines of the same block are connected to the same driver.

Moreover, according to a second semiconductor memory device of the present invention, there is provided a semiconductor memory device comprising; a memory cell array wherein a memory cell unit having a plurality of electrically rewritable memory cells is formed, and the memory cell unit is formed on a semiconductor substrate in a matrix array; row selecting means for selecting a word line of the memory cell array; and column selecting means for selecting a bit line of the memory cell array; wherein a word line driver for driving the word line is provided at both sides of the memory cell array in a ratio of one to two memory cell units, and the plurality of the word lines provided to cross the memory cell unit of the same row are connected to the same driver.

Furthermore, according to a third semiconductor memory device of the present invention, there is provided a semiconductor memory device comprising; a memory cell array wherein a memory cell unit having a plurality of electrically rewritable memory cells is formed, and the memory cell unit is formed on a semiconductor substrate in a matrix array; a plurality of control gate lines provided to cross the memory cell unit of the same row; and bit lines to cross the memory cell unit of the same column, wherein a word line driver for driving the word line is provided at both sides of the memory cell array in a ratio of one to two memory cell units, the plurality of the word lines provided to cross the memory cell unit of the even row are connected to the driver provided at one end side of the memory cell array, and the plurality of the word lines provided to cross the memory cell unit of the odd row are connected to the driver provided at the other end side of the memory cell array.

The following points can be considered as a desirable specific form.

(1) Row decoders are provided to correspond to the word line drivers at both sides of the memory cell array;

(2) Each block of the word lines is alternately connected to the word line drivers of both side of the memory cell array every one block or two blocks;

(3) The memory cell is a nonvolatile memory cell in which a floating gate (charge storage layer) and a control gate are layered;

(4) The memory cell unit is an NAND cell having a plurality of memory cells connected in series;

(5) The NAND cell is connected to the bit line through a select gate line of a drain side, connected to a cell source through the select gate line of a source side, and each select gate line of the drain and source sides is controlled by the driver circuit; and (6) The memory cell unit is an AND cell having a plurality of memory cells connected in parallel, or a DINOR cell.

(7) word lines in the same cell unit are connected to one of driver circuits which are disposed at the right or left side of cell array.

Moreover, according to a fourth semiconductor memory device of the present invention, there is provided a semiconductor memory device comprising; a memory cell array wherein a memory cell or a memory cell unit having a plurality of the memory cells connected is provided in an array form; a plurality of main row decoders and main word line drivers provided at both sides of the memory cell array; a spare memory cell array for saving a defective cell of the memory cell array; a plurality of spare word line drivers arranged at both sides of the spare memory cell array; and a defect saving circuit for storing an address of a detective cell to select the spare word line driver in a case where an inputted address is conformed to the address of the defective cell; wherein the word lines selected by the main row decoders and driven by the main word line drivers are divided into blocks each having a plurality of continually numbered word lines, and the word lines of the same block are selected by the same driver.

The following points can be considered as a desirable specific form.

(1) Means for saving the defective bit saves the defective cell by a unit of a row decoder or a unit of the multiple number of the row decoders;

(2) Each of the row decoders selects a unit of the memory cell unit or a unit of the multiple number of the memory cell units;

(3) Means for saving the defective bit saves a different defective address at each side of the memory cell array;

(4) Each block of the word lines is alternately connected to the word line drivers of both sides of the memory cell array every one block or two blocks.

According to the first to third semiconductor memory devices of the present invention, the driver circuits (word line drivers) are provided at both sides of the memory cell array. However, in each of the memory cell units of the same row, the control gate lines (word lines) are connected to one of the driver circuits (same driver circuits) regardless of odd or even control gate lines. Therefore, in the same memory cell unit, there is no disadvantage in which a time difference between charging/discharging in the odd and even control gate lines is generated, a stable operation can be performed at the time of reading and writing, and reliability can be improved.

Moreover, the number of row decoders is not increased, it is not needed that an output signal of the row decoder circuit is inputted to the right and left driver circuits without running on the memory cell array, and resistance of the wire of the decoder circuit and delay due to capacitance can be reduced, so that the high speed reading and writing can be performed. Moreover, since the wiring capacity of the output node of the decoder circuit can be largely reduced, the size of the transistor forming the decoder circuit can be reduced, and the chip area and the consumption of electrical power can be reduced. Furthermore, the number of wiring layers, which is necessary for the output signal of the decoder circuit, can be reduced, the manufacturing process can be simplified, and the yield can be improved, so that same row decoder is increased whereby, the saving efficiency of the bit line can be improved, and the manufacturing cost can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The embodiments of the present invention will be explained with reference to the drawings.
(First Embodiment)

Figure 4:
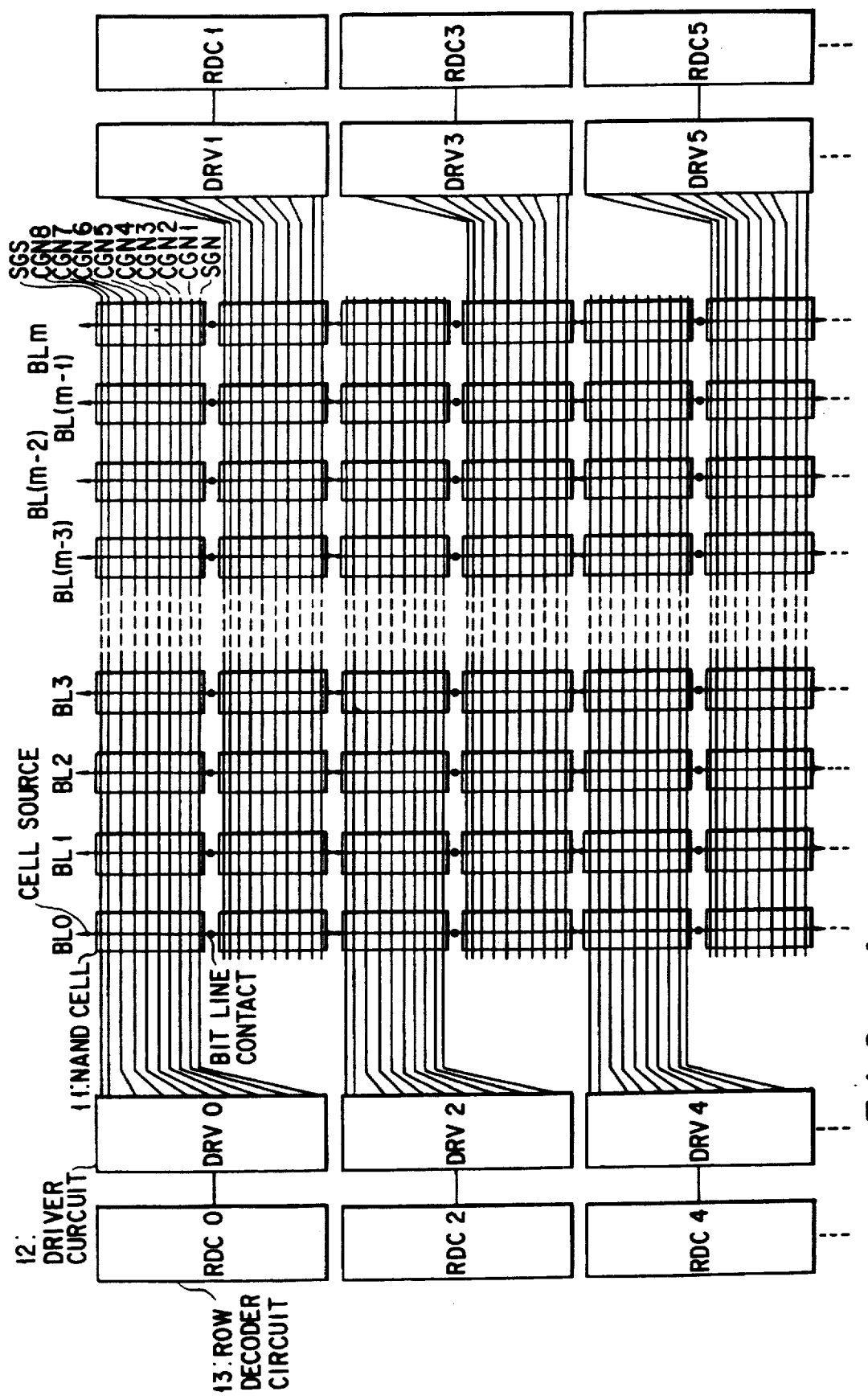
FIG. 4 is a view showing a layout of a core section of an NAND cell type EEPROM of a first embodiment of the present invention.

FIG. 4 shows a layout of the core section of the NAND cell type EEPROM of the first embodiment of the present invention. BL0 to BLm are bit lines, CGN1 to CGN8 are control gate lines, and SGN, SGS: are a drain side and a source side selection gate line, respectively.

As shown in the figure, NAND cells 11 are formed in a matrix (for example, $\underline{m}$ in a row direction and $\underline{n}$ in a column direction) to constitute a memory cell array. A plurality of control gates CG (word lines) and selection gate lines are respectively provided to cross an NAND cell group of the same row, and the bit lines BL are provided to cross the NAND cell group of the same column, respectively. In the NAND cells 11, it is noted that a floating gate and a control gate are layered on a semiconductor substrate through an insulation film, so that a nonvolatile memory cell having an FETMOS structure is formed, and a plurality of the nonvolatile memory cells are connected in series.

One driver circuit 12 is provided at both sides of the memory cell array in a ratio of one to two NAND cell groups, respectively. A row decoder circuit 13 is connected to each driver circuit 12. More specifically, an even driver circuit 12 is provided at the left side of the memory cell array and an odd driver circuit 12 is provided at the right side of the memory cell array. Then, the row decoder circuit 13 is provided at each driver circuit 12 to be opposite to the array.

Each driver circuit 12 comprises a drive element for the control gate line and a drive element for the select gate line to the same NAND cell group. Then, the control gate line of the even numbered NAND cell group and the select gate line are connected to the even driver circuit of the left side of the FIG. 4, and the control gate line of the odd numbered NAND cell group and the select gate line are connected to the odd driver circuit of the right side of FIG. 4.

Figure 5:
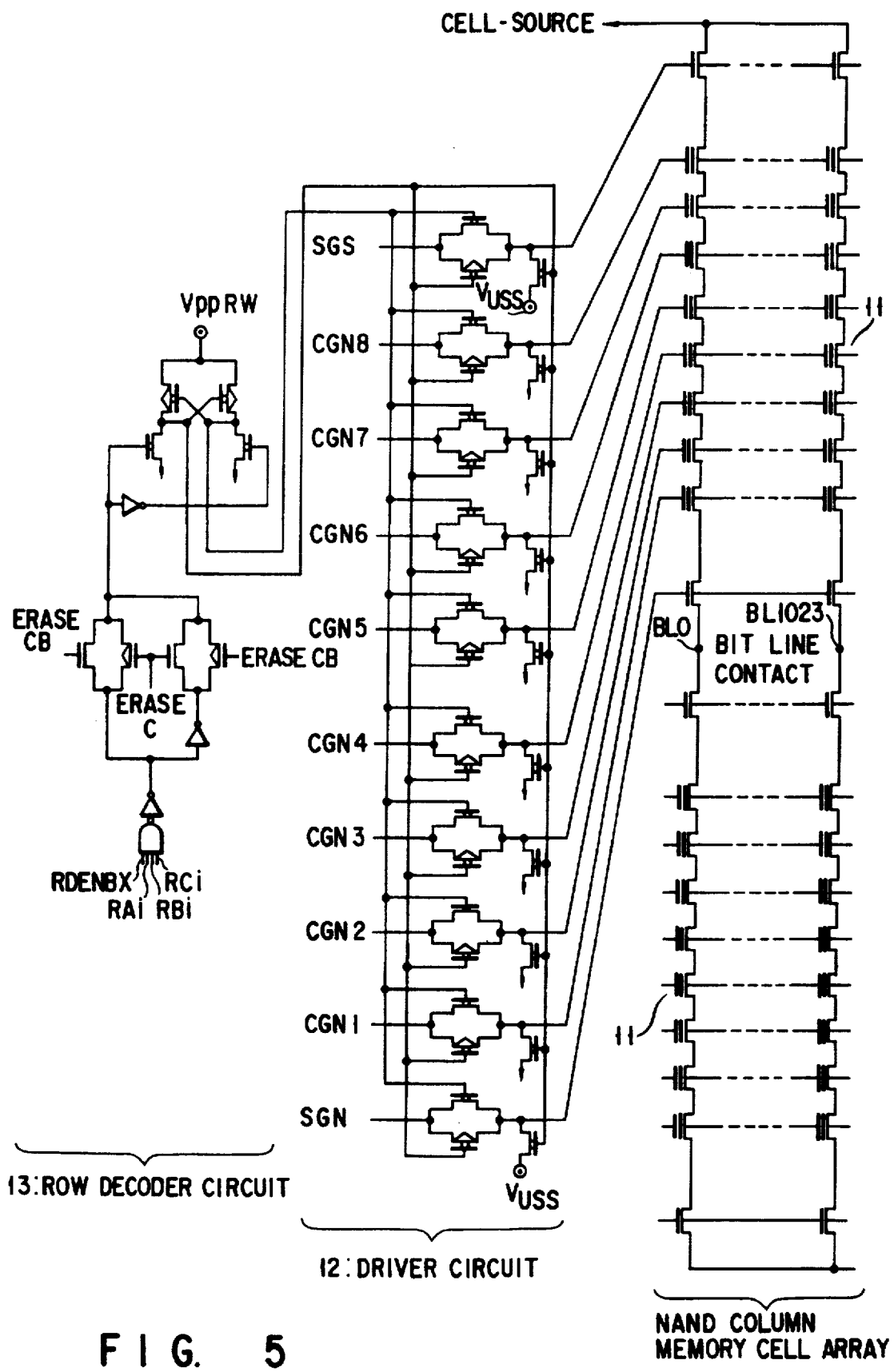
FIG. 5 is a view showing a jth decoder circuit of the NAND cell type EEPROM of FIG. 4, and its driver circuit, and NAND column memory cell array.
Figure 6:
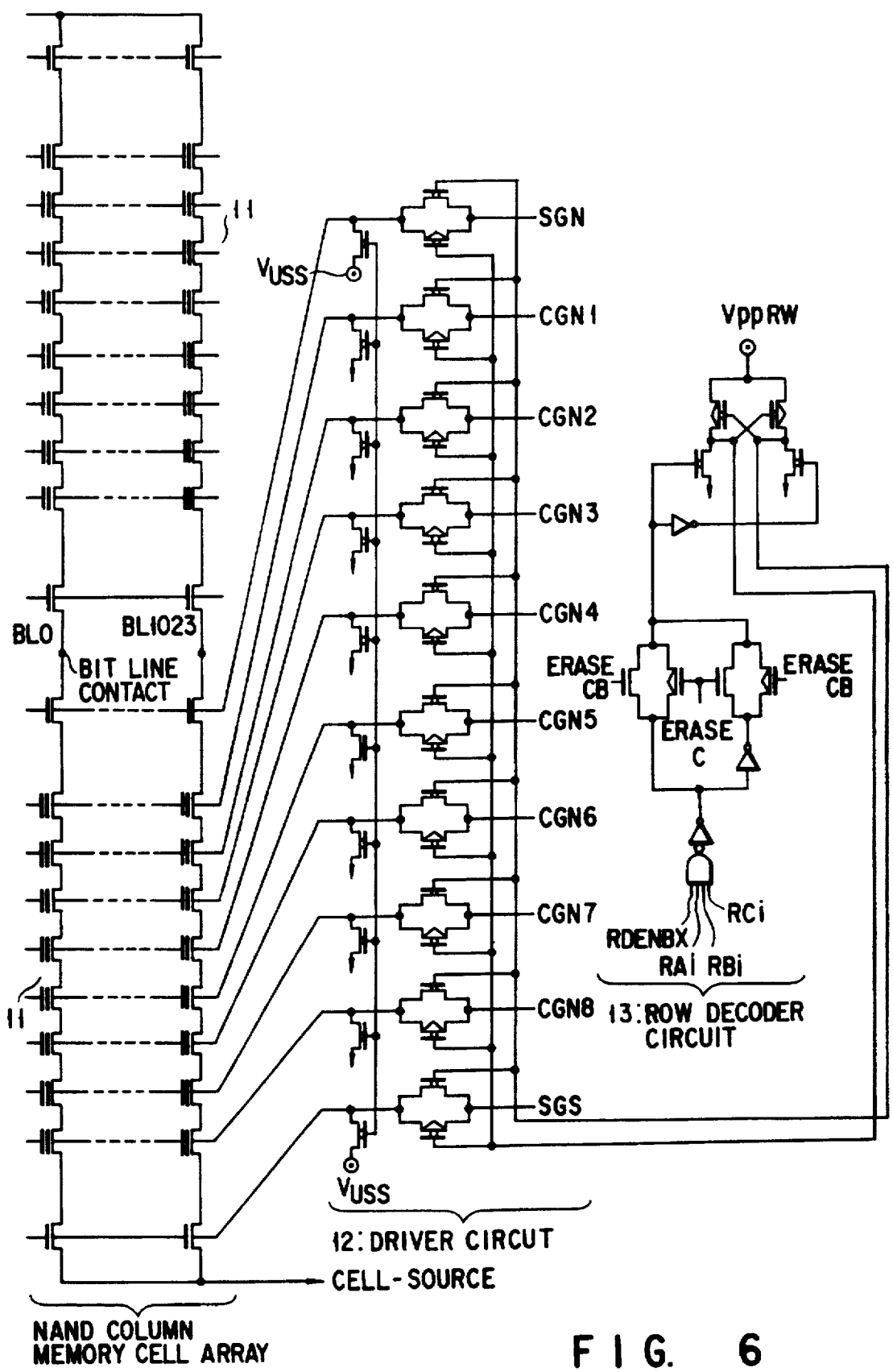
FIG. 6 is a view showing a (j+1)th decoder circuit of the NAND cell type EEPROM of FIG. 4, and its driver circuit, and NAND column memory cell array.

FIGS. 5 and 6 show a j th row decoder circuit of the NAND cell type EEPROM of FIG. 4 and a (j+1)th row decoder circuit, corresponding driver circuits, and two NAND cell groups. RAi, RBi, and RCi are outputs of a row predecoder, an ERASECB and ERASEC are control signals for erasing, and VppRW is a high voltage generated by an internal charge pump circuit.

As shown in FIGS. 4, 5 and 6, the corresponding row decoder circuit 13 and the driver circuit 12 are alternately provided at the right and left sides of the memory cell array every the NAND cell group. Then, in the same NAND cell group, the control gates and the select gate lines which cross the same NAND cell group are connected to the same driver circuit 12. Due to this, in the same NAND cell, no potential difference is generated by a difference between charging/discharging time of the control gate lines and the select gate lines, which cross the same NAND cell, at the time of reading operation and the writing operation whereby, reading and writing can be stably operated.

Figure 1:
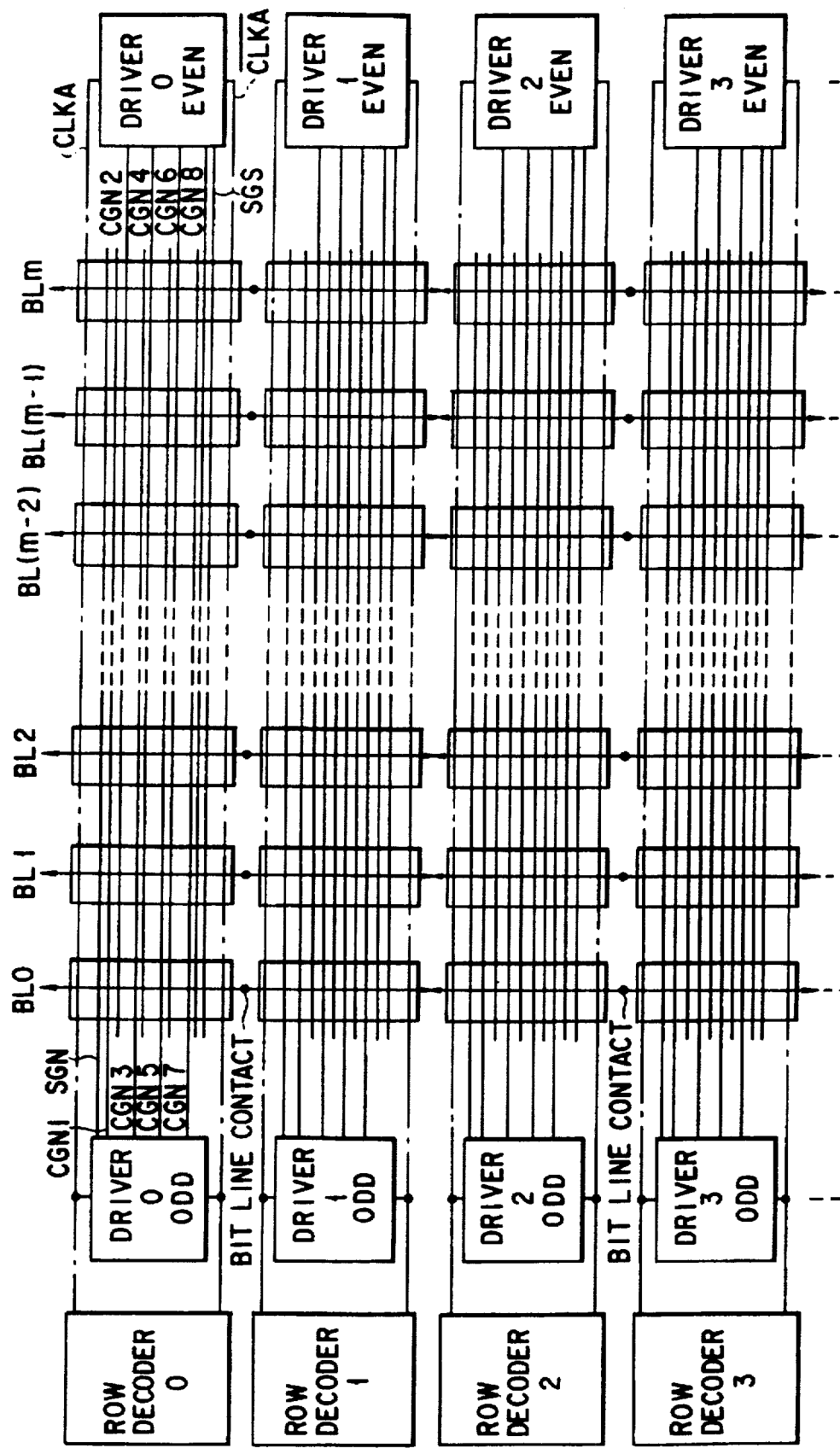
FIG. 1 is a view showing a layout of a core section of the conventional 4M, 16M, and 32M bit NAND cell type EEPROM.
Figure 2:
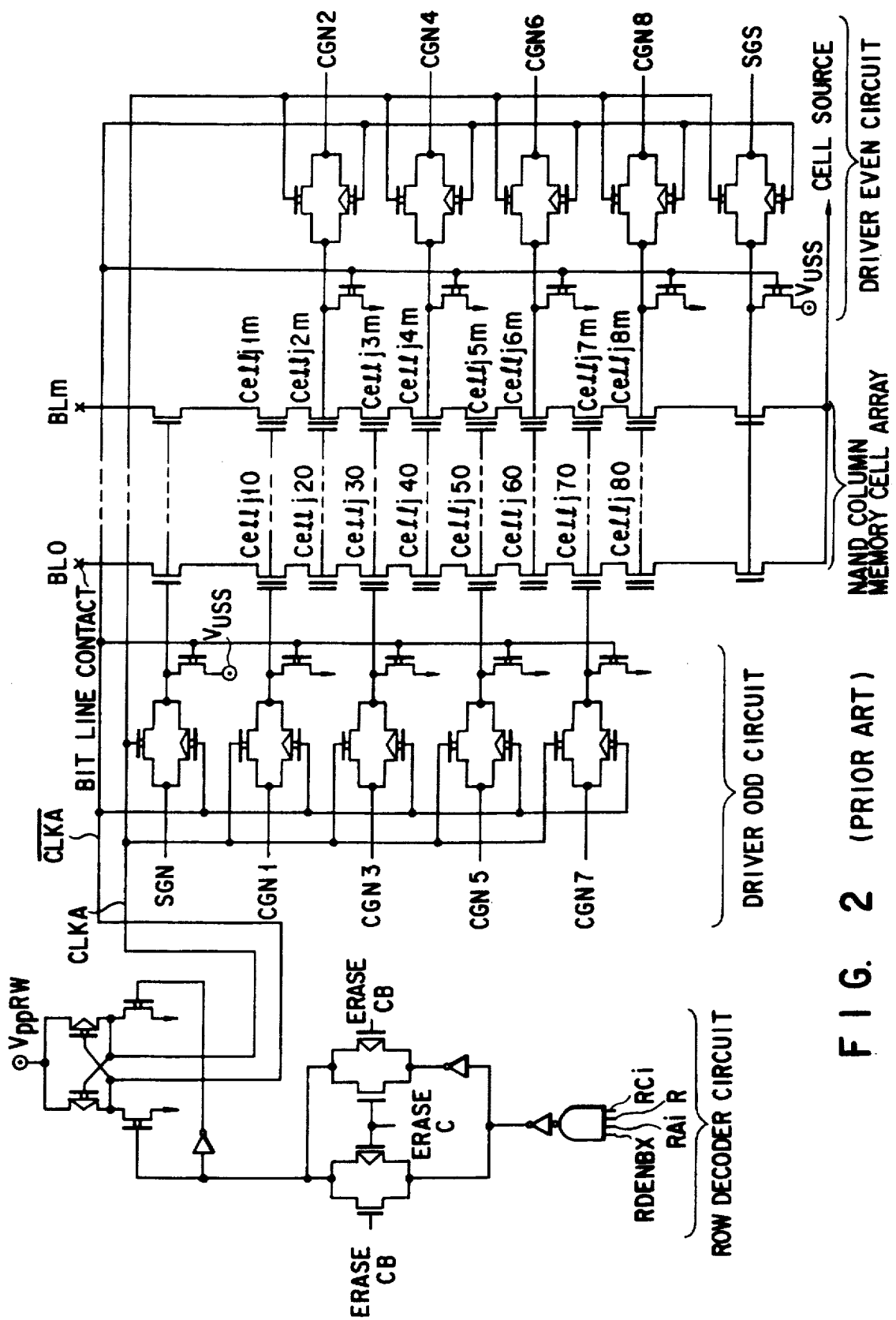
FIG. 2 is a view showing a first decoder circuit of the NAND cell type EEPROM of FIG. 1, a driver circuit, and a circuit of an NAND cell row.

Moreover, since the driver circuit 12 is provided in a ratio of one to two NAND cell groups, the driver element to one control gate line may be provided in an area for two pitches of the control gate line. Even if the pitch of the control gate line becomes narrower as shown in the conventional case of FIG. 1, the operation can be suitably performed. Furthermore, since the driver circuits 12 to the same NAND cell group are not separated, it is not needed that the output signal be divided into right and left. Then, a resistance capacitance due to the wire length can be reduced.

Therefore, according to the above embodiment, in spite of the point that the driver circuits are provided at both sides of the memory cell array, it is possible to uniformly set charging/discharging of the control gate lines and the select gate lines in the same NAND cell, the stable operation can be performed at the time of the reading operation and the writing operation, and reliability can be improved.

Also, the number of the row decoder circuits is not increased, it is not needed that the output of the row decoder circuit crosses the memory cell array to be inputted to the right and left driver circuits, the manufacturing process can be simplified, and the yield can be improved, so that the manufacturing cost can be largely reduced.

According to the above-mentioned embodiment, the word line of the same cell unit is selected from one of the driver circuits separated into the right and left sides of the array. Therefore, since only one of the right and left driver circuits may be selected at the time of the operation, the load capacity of the voltage booster circuit becomes half. Therefore, the area of the voltage booster circuit can be reduced, and data erasing/writing time can be shortened.

In addition to the point that the load capacity of the voltage booster circuit becomes small, the high-speed operation can be improved by the reduction of data erasing/writing time since the address decoder circuit is provided at right and left besides the word line driver circuits, and the address signal does not have to cross the memory array, and the time delay due to the wiring is reduced.

The above embodiment explains the case in which the NAND cell type EEPROM is used, the row decoder circuits and the driver circuits, which correspond to the NAND cell group of the odd and even NAND cell groups in the column direction, are arranged to be alternately divided to the right and left sides of the memory cell array. However, the present invention is useful in a case in which the corresponding row decoder circuits and the driver circuits are provided to be alternately divided to the right and left sides of the memory cell array every plurality of rows of the NAND cell group, for example, two rows.

Figure 7A:
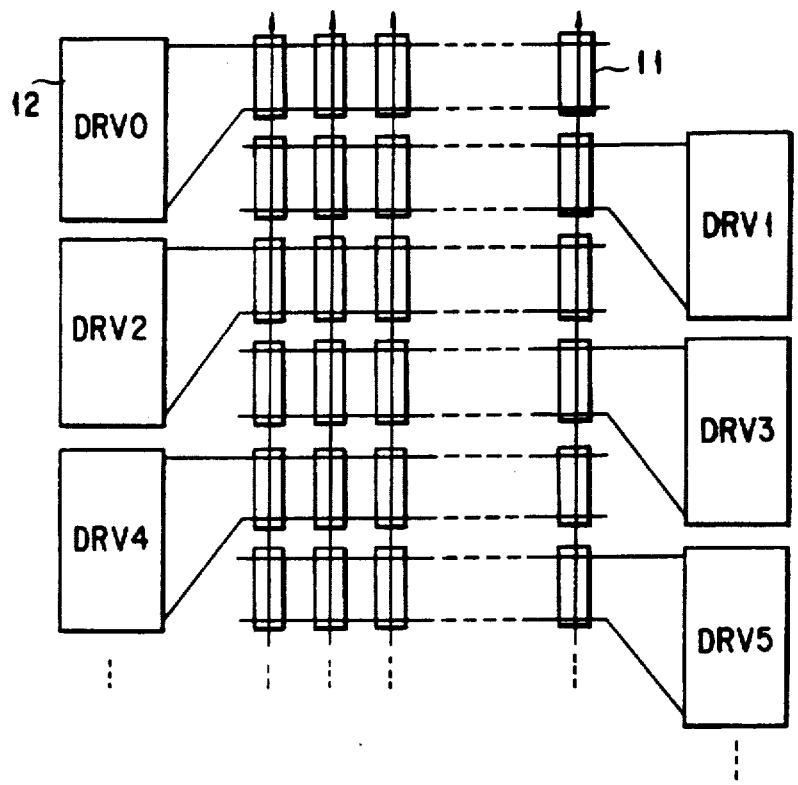
FIG. 7A is a view showing a modification of the present invention.
Figure 7B:
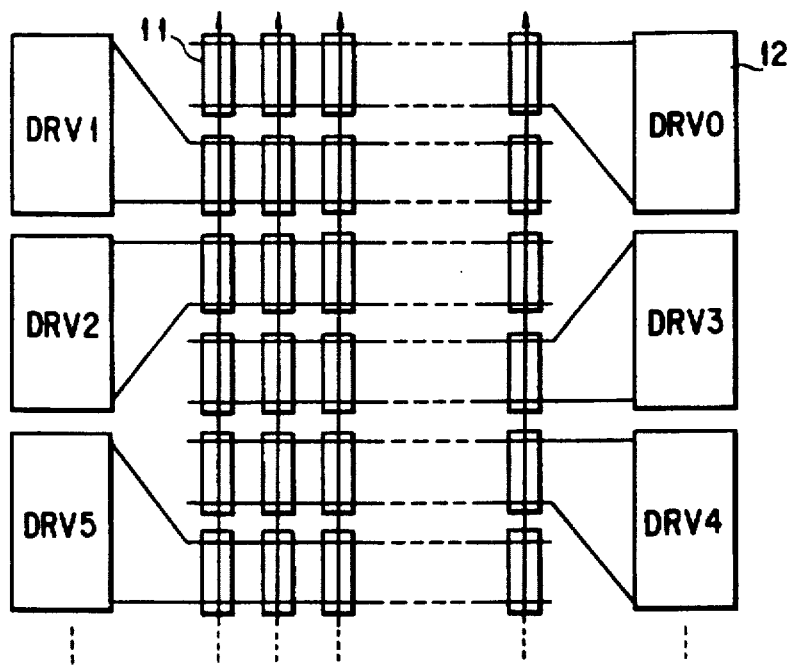
FIG. 7B is a view showing a modification of the present invention.

FIG. 7A shows a case in which the driver circuits are shifted by a half pitch at the right and left sides of the memory cell array. FIG. 7B shows a case in which the driver circuits are provided to be alternately divided to the right and left sides of the memory cell array every two rows of the NAND cell group. In such a structure, the same effect as the first embodiment can be obtained. If the wire area which is from the driver circuit to the NAND cell can be sufficiently available, the driver circuits can be provided to be alternately divided to the right and left sides of the memory cell array every three or more rows of the NAND cell group.

The present invention can be applied to not only the NAND cell type EEPROM but also the other nonvolatile memories, such as a normal NOR structure, an AND structure, or an EEPROM having a DINOR structure. Moreover, the present invention is useful in a DRAM having an NAND structure or a cascade structure other than the nonvolatile memories. In addition, the present invention can be variously modified in the range without departing from the gist of the present invention.

Figure 8:
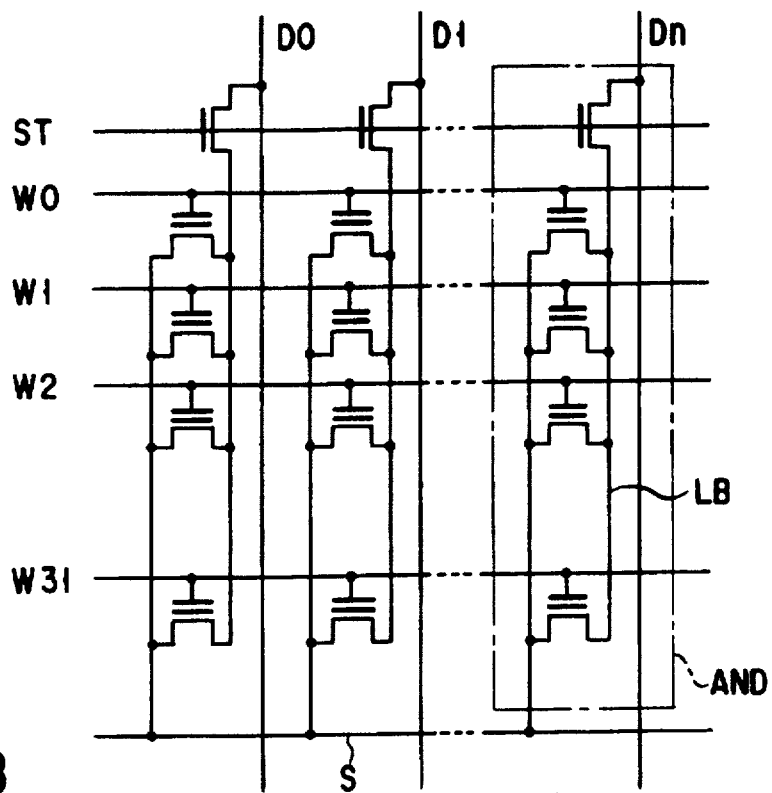
FIG. 8 is an equivalent circuit diagram showing a DINOR cell type EEPROM.
Figure 9:
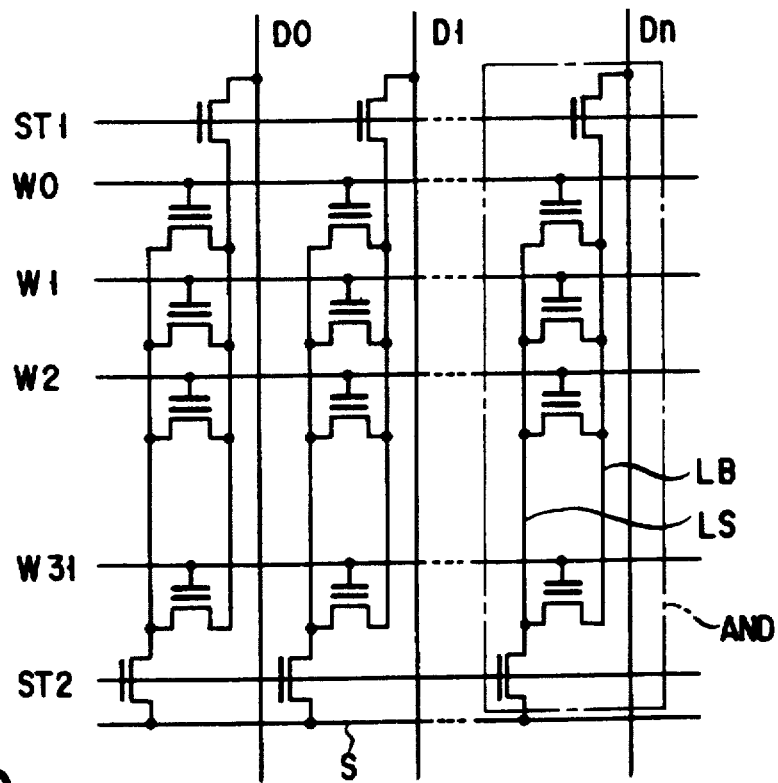
FIG. 9 is an equivalent circuit diagram showing a DINOR cell type EEPROM.

FIG. 8 shows an equivalent circuit of the DINOR cell type EEPROM, and FIG. 9 shows an equivalent circuit of the AND cell type EEPROM. In FIGS. 8 and 9, Ws (W0, W1 to W31) are control gates, ST, ST1, and ST2: select gates, Ds (D0, D1 to Dn): main bit lines, S: a common source line, LB: a local bit line, LS: a local source line, and AND: an AND cell block.

In both the DINOR type and the AND type, the wire pitch of the control gate (word line) is small. Due to this, it is difficult to design the row decoder circuits and the word line driver circuits. Therefore, it is extremely useful in providing the driver circuits and the row decoder circuits at both sides of the memory cell array.

(Second Embodiment)

Figure 10:
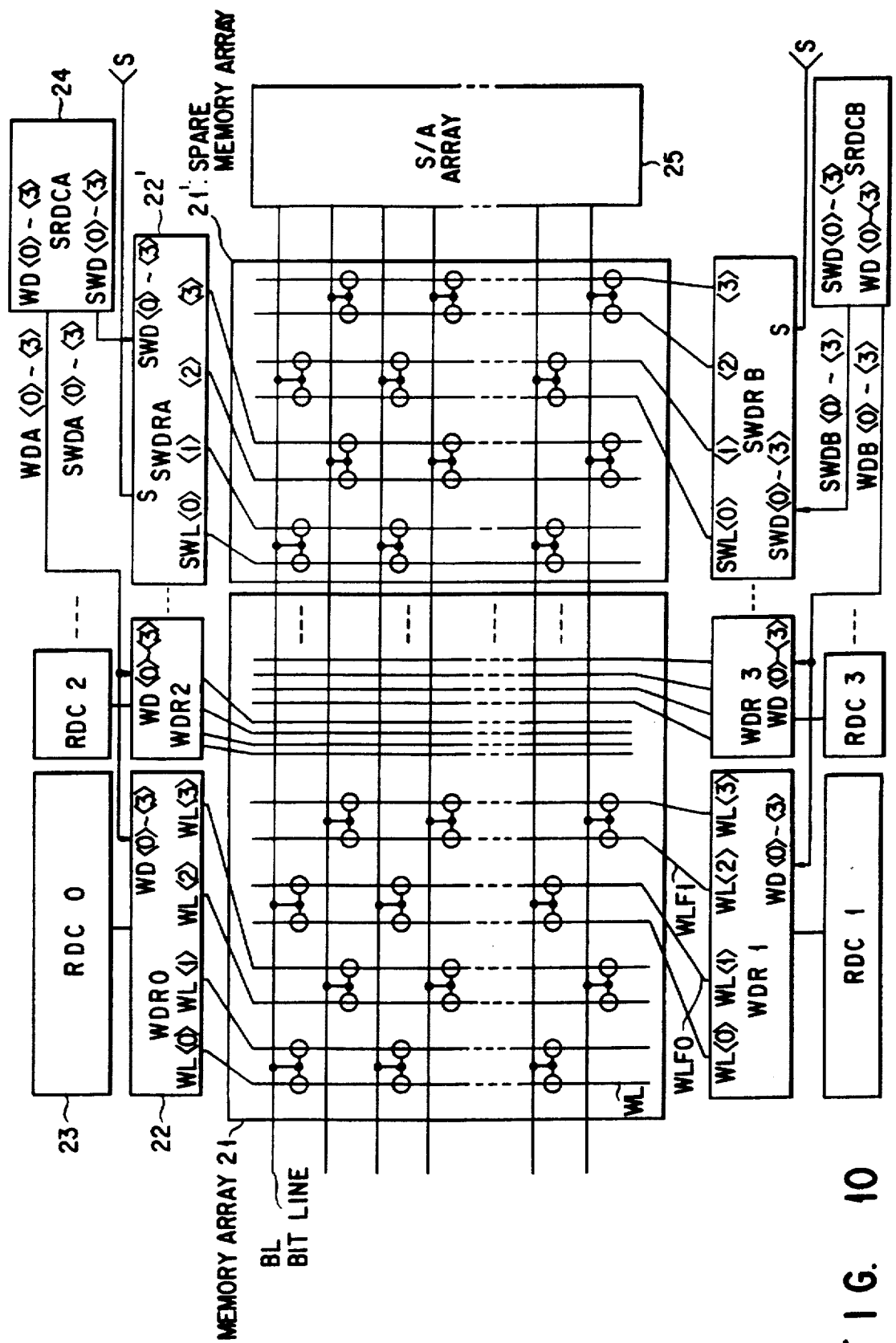
FIG. 10 is a view showing the basic structure of the semiconductor memory device of a second embodiment of the present invention.

FIG. 10 is a view showing the basic structure of the semiconductor memory device of a second embodiment of the present invention having a defective bit saving function.

Row decoders 23 (RDC0 . . . ) are provided at both sides of the memory cell array 21 in which the DRAM memory cells are arranged in an array form. The selection of the word line group is performed every four word lines WL through word line drivers 22 (WRD0 . . . ). The group of the word lines (four word lines), which is selected by one row decoder 23, is disposed in a form to be adjacent to the memory cell array 21. A spare memory cell array 21' is connected onto the same bit line BL as the memory cell array 21. In a case where a saving address is compared with an address (not shown) inputted from an outer unit, and both are conformed to each other, the spare array 21 is selected by defect saving circuits 24 (SRDCA, SRDCB) through spare word line drivers 22' (SWDRA, SWDRB).

The defect saving circuits 24 are arranged at both sides of the spare memory cellarray 21', and can save the defect independently at the respective sides. In this case, S is a signal for discriminating the right and left of a sense amplifier 25 (S/A). By such an arrangement, for example, in a case where WLF0 and WLF1 are short-circuited, RDC1 of the row decoders 23 may be saved, and the address may be stored in the SRDCB of the defect saving circuit 24.

Figure 3:
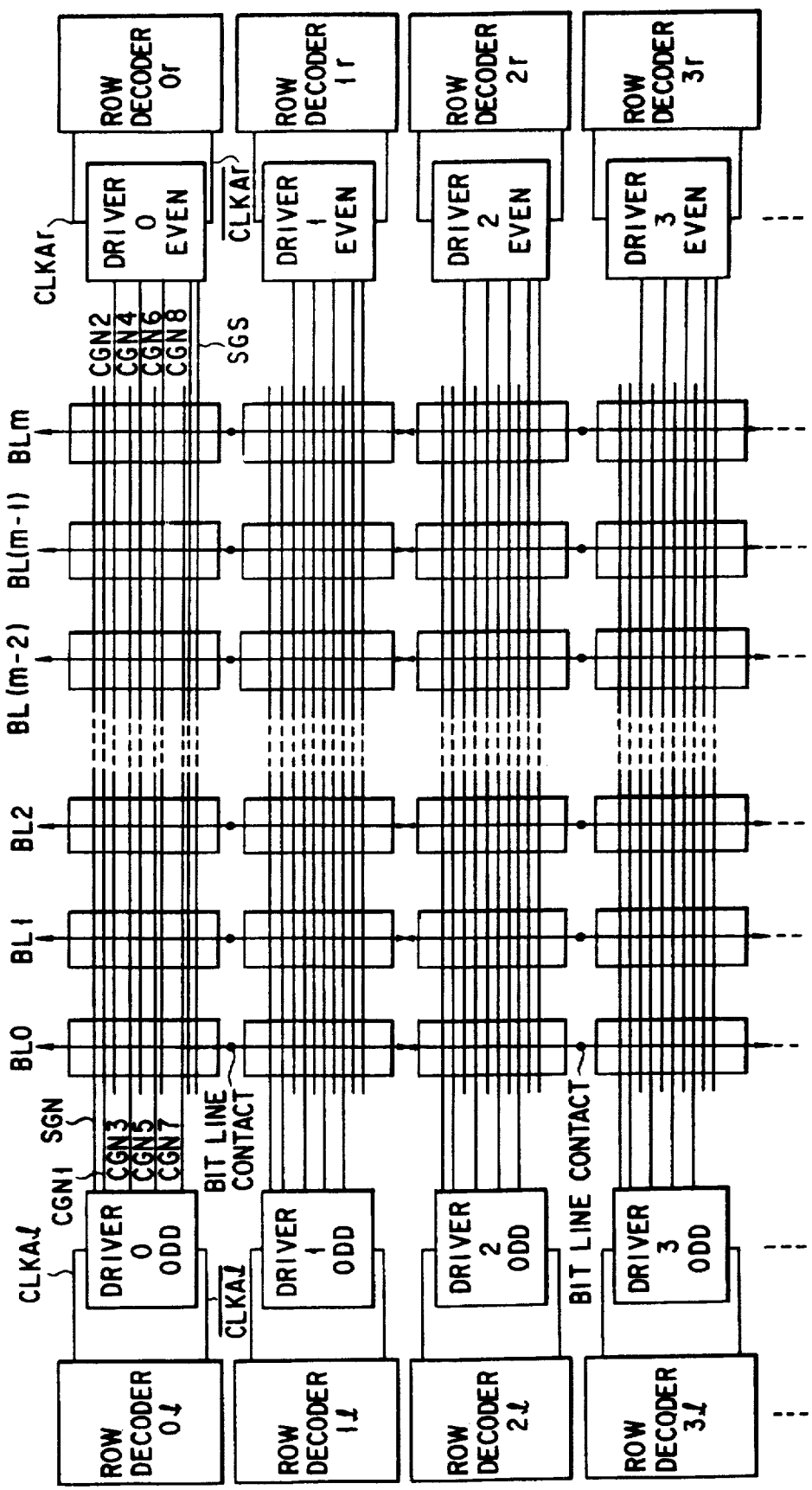
FIG. 3 is a view showing an example in which decoder circuits are provided at right and left sides of the memory cell array.

At this time, since the defect saving circuit SRDCA in the opposite side may not be used, the defect saving circuit SRDCA can be used to save the defect of the other location. On the other hand, in the layout of driving the word lines in a comb-like manner as shown in FIG. 3, two row decoders provided at the right and left sides must be replaced, and both defect saving circuits SRDCA and SRDCB must be used.

As mentioned above, according to the present invention, the word line driver 22 and the row decoder 23 are provided at both sides of the memory cell array 21, and the word lines, which are divided into blocks each having four continually numbered word lines, are connected alternately to the drivers 22 of both sides. Due to this, the word lines of the same block are selected by the same row decoder 23. The rate of which the adjacent word lines of the memory cell array are selected by the same row decoder is increased. Therefore, even if the defect due to the short-circuit between the word lines is generated, the rate of which such a defect can be saved by one row decoder 23 is increased whereby, the saving efficiency of the bit line can be improved, and the manufacturing cost can be reduced.

It is noted that the number of the word lines which are divided into blocks is not limited to four, and can be suitably changed in accordance with the specification. Moreover, according to the above embodiment, the word line drivers, which drive the plurality of the lines, are integrally formed. However, the word line drivers may be separated every word line. In a word, the present invention may be structured such that the row decoder can select the plurality of continually numbered word lines through the word line driver, and the word lines of the same block can be selected by the same row decoder. Moreover, the memory cell is not limited to the DRAM, and the other nonvolatile memory cells such as PROM and EEPROM can be used.

(Third Embodiment)

Figure 11:
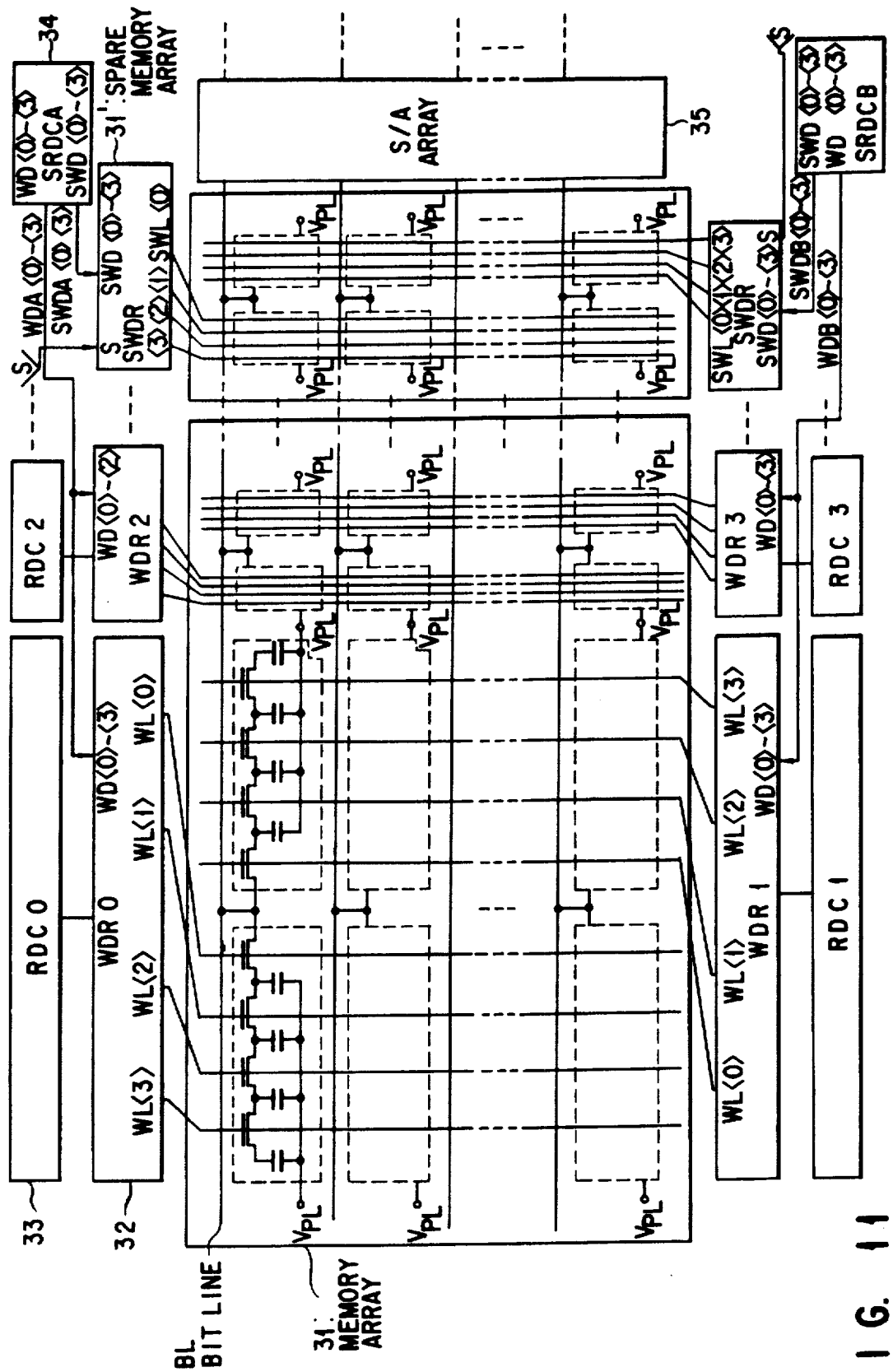
FIG. 11 is a view showing the basic structure of the semiconductor memory device of a third embodiment of the present invention.

FIG. 11 is a view showing the basic structure of the semiconductor memory device of a third embodiment of the present invention having a defective bit saving function. According to this embodiment, there is used an array having a memory cell unit (NAND cell) in which the memory cells are connected in series.

The structure of the third embodiment is basically the same as that of the second embodiment except that the array structure is different from the second embodiment. Reference numerals 31 to 35 of FIG. 11 correspond to reference numerals 21 to 25 of FIG. 10, respectively. The number of the word lines selected by one row decoder 33 is conformed to the number of the word lines of one memory cell unit. Whereby, one address of the row decoder 33 is stored, so that the unit of the memory cell unit can be replaced.

Generally, in the memory structure, when data is read from the memory cell located far from the bit line contact, data must be read out through the near memory cell. If the defect occurs in the near memory cell, data of the memory cell located far from the bit line contact cannot be read out. Therefore, if even one bit of the memory cell unit is defective, the entire memory cell unit must be changed. To solve this problem, if the unit of the row decoder corresponds to the memory cell unit as mentioned in the above embodiment, the saving of the unit can be realized by storing one address.

At this time, if one defect saving circuit (for example, SRDCA) is used for the defect of one memory cell unit, the other defect saving circuit (for example, SRDCB) may not be used. On the other hand, in the layout of driving the word lines in a comb-like manner as shown in FIG. 3, two row decoders must be replaced, and both defect saving circuits SRDCA and SRDCB must be used. Therefore, according to the present invention, the defect saving efficiency is doubled.

Figure 12A:
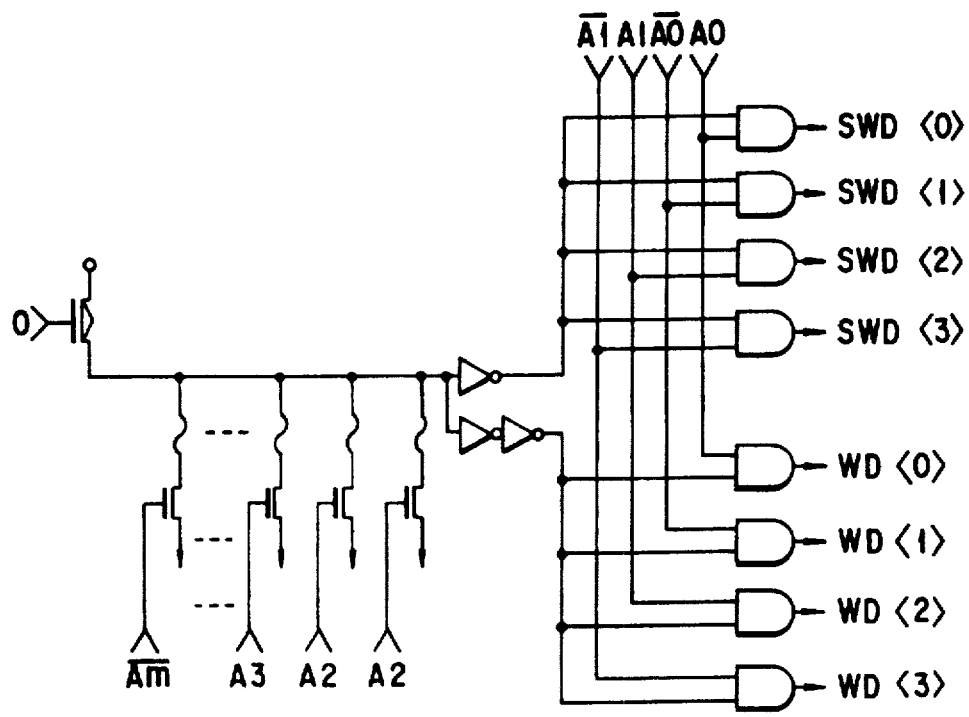
FIG. 12A is a view showing an example of a defect saving circuit.
Figure 12B:
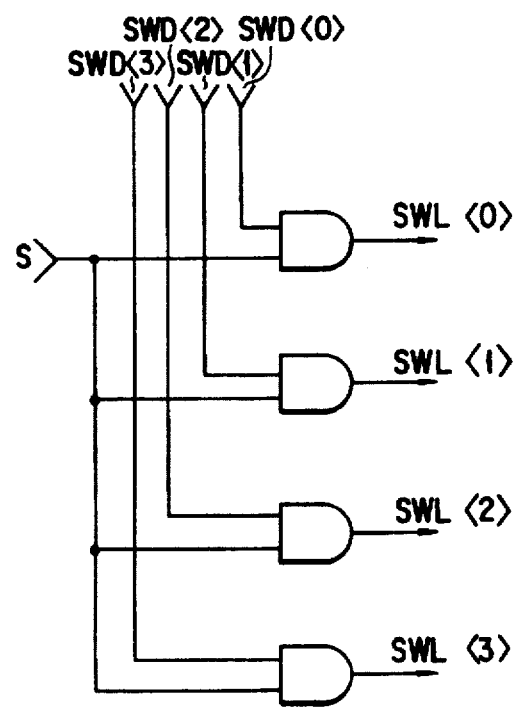
FIG. 12B is a view showing an example of a spare word line driver circuit.
Figure 13:
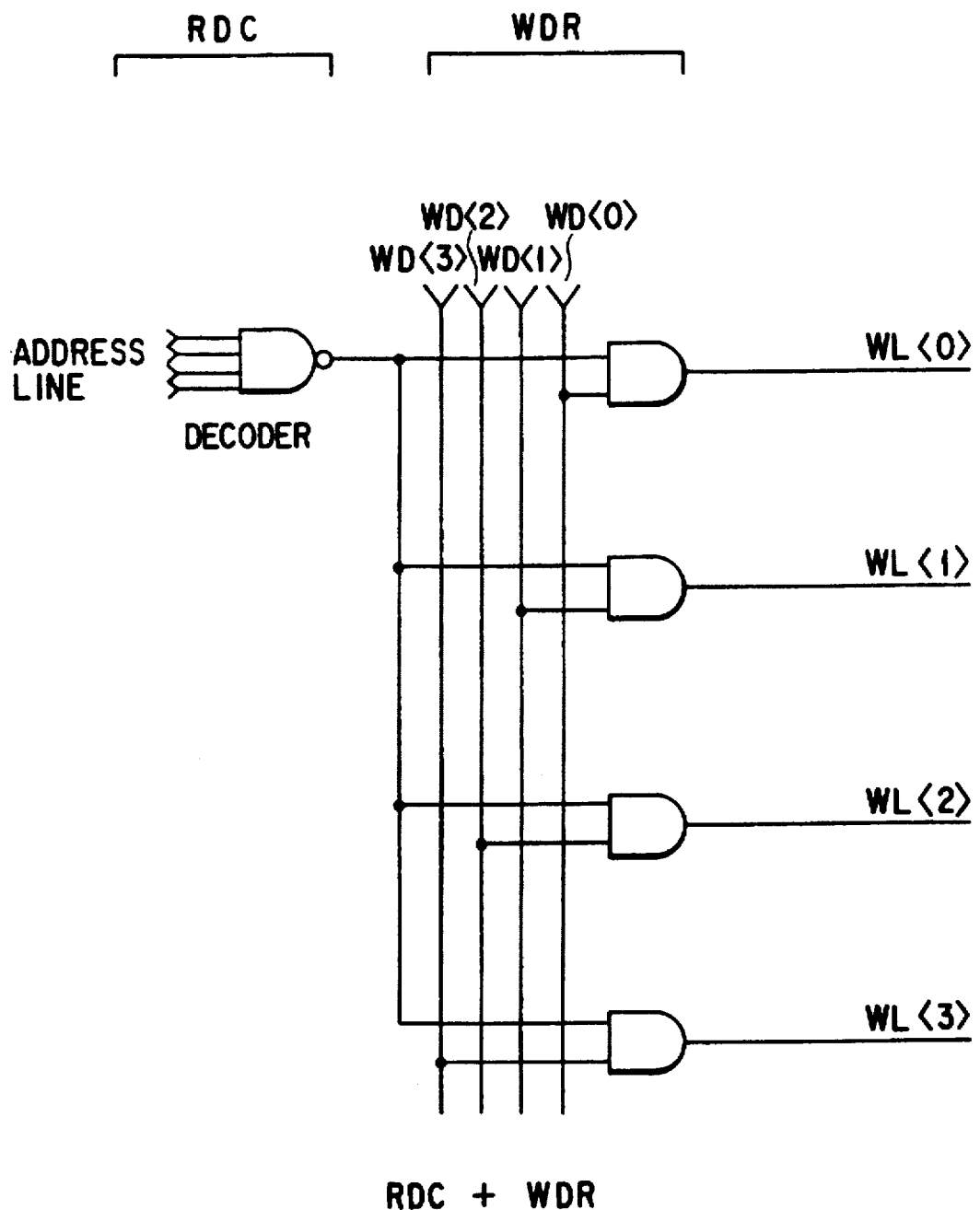
FIG. 13 is a view showing an example of a row decoder circuit and that of a word line driver circuit.

FIG. 12A shows the specific structure of the defect saving circuit SRDC, and FIG. 12B shows the specific structure of the spare word line driver circuit. Also, FIG. 13 shows the specific structure of the row decoders (RDC0 . . . ) and the word line drivers (WDR0 . . . ).

Though this is not shown as an embodiment, such a concept can be similarly realized by the nonvolatile memory such as the NAND cell type EEPROM or a flash EEPROM, and an SRAM, and this is the scope of the invention.

Moreover, according to the present invention, the defect saving is performed by the unit of the row decoder. However, this can be performed by the unit of a multiple number of the row decoders. Moreover, the above embodiment explains the case in which the unit of the row decoder is conformed to the unit of the memory cell unit in the case of the NAND type cell. However, the unit of the row decoder may be conformed to a multiple number of the memory cell unit. In place of the circuits of the present invention shown in FIGS. 12 and 13, the other circuit form may be used if the same function as the circuits of FIGS. 12 and 13 is performed. In such a case, the present invention is useful.

As mentioned above, according to the present invention, the driver circuits are provided at both sides of the memory cell array, the plurality of the control gates, which are provided to cross the memory cell unit of the same row, are connected to the same driver circuit. Due to this, charging/discharging time for the control lines and the select gate lines in the same cell can be uniformly set, the difference in the potential level between charging/discharging time is not generated when the reading and writing are started, whereby the stable operation can be performed, and the semiconductor device having high reliability can be realized.

Moreover, even if a defect such as a short-circuit between the word lines is generated, such a defect can be saved by one row decoder since the rate of which the adjacent word lines of the memory cell array are selected by the same row decoder is high. Therefore, there can be realized the semiconductor memory device which can prevent useless saving when the short-circuit between two word lines is generated, and which can improve the saving efficiency of the defective bit.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:

a memory cell array comprising a plurality of memory cell units arranged in a matrix form, each memory cell unit having a plurality of memory cells connected to one another;

a plurality of word-line drivers which are arranged in two rows, said word-line drivers, except at least one located at ends of rows, being divided into groups each including two word-line drivers, said groups of two word-line drivers and at least one word-line driver located at ends of rows being provided alternatively on a first and a second side of said memory cell array;

word lines for selecting said memory cells when driven by said word-line drivers, said word-lines being divided into word-line blocks each connected at a first end to one memory cell unit and at a second end to one word-line driver;

bit lines for writing and reading data to and from said memory cells;

row selecting means for selecting said word lines; and column selecting means for selecting said bit lines;

wherein said word-line blocks are arranged in a row, said word-line blocks, except at least one located at ends of the row, are divided into groups of two word-line blocks and the two word-line blocks of each group are connected to the two word-line drivers of one group, respectively.

2. The semiconductor memory device according to claim 1, wherein said memory cell unit is formed by connecting said plurality of said memory cells in series.

3. The semiconductor memory device according to claim 1, wherein said memory cell unit is formed by connecting said plurality of memory cells in parallel.

4. The semiconductor memory device according to claim 1, wherein only one of the driver circuits provided at a right and left of the memory cell array is selected to be operated during data erasing and writing.

5. The semiconductor memory device according to claim 1, wherein the row selecting means is provided at both sides of said memory cell array to correspond to said word-line driver.

6. The semiconductor memory device according to claim 1, further comprising:

a spare memory cell array for saving a defective cell of said memory cell array;

a plurality of spare word line drivers arranged at both sides of said spare memory cell array; and a defect saving circuit for storing an address of a defective cell to select said spare word line driver in a case where an inputted address coincides with the address of the defective cell.

7. The semiconductor memory device according to claim 5, further comprising a signal line for supplying an output signal sent from said row selecting means to said word-line driver, wherein said signal line does not cross said memory cell array.

8. The semiconductor memory device according to claim 6, wherein said memory cell unit is formed by connecting said plurality of said memory cells in series.

9. The semiconductor memory device according to claim 5, wherein said memory cell unit is formed by connecting said plurality of memory cells in parallel.

10. The semiconductor memory device according to claim 6, wherein only one of the driver circuits provided at a right and left of the memory cell array is selected to be operated during data erasing and writing.

11. The semiconductor memory device according to claim 6, wherein the row selecting means is provided at both sides of said memory cell array to correspond to said word-line driver.

12. The semiconductor memory device according to claim 10, further comprising a signal line for supplying an output signal sent from said row selecting means to said word-line driver, wherein said signal line does not cross said memory cell array.

* * * * *

UNITED STATES PATENT AND TRADEMARK OFFICE
CERTIFICATE OF CORRECTION

PATENT NO. : 5,615,163
DATED      : March 25, 1997
INVENTOR(S): Koji SAKUI, et al.

It is certified that error appears in the above-indentified patent and that said Letters Patent is hereby corrected as shown below:

On the title page, Item [30], the Foreign Application Priority Data is missing. It should read:

--[30]

Dec. 21, 1993  [JP]  Japan...............5-321589
   Aug. 23, 1994  [JP]  Japan...............6-198840  --

Signed and Sealed this

Twenty-second Day of July, 1997

Attest:

BRUCE LEHMAN

*Attesting Officer*       *Commissioner of Patents and Trademarks*